United States Patent [19]
Gola et al.

[11] Patent Number: 5,528,184
[45] Date of Patent: Jun. 18, 1996

[54] POWER-ON RESET CIRCUIT HAVING A LOW STATIC POWER CONSUMPTION

[75] Inventors: Alberto Gola, Broni; Giona Fucili, Magenta, both of Italy

[73] Assignee: SGS-Thomson Microelectronics, S.r.l., Agrate Brianza, Italy

[21] Appl. No.: 85,207

[22] Filed: Jun. 28, 1993

[30] Foreign Application Priority Data

Jun. 26, 1992 [EP] European Pat. Off. .............. 92830336

[51] Int. Cl.[6] ........................... H03K 17/22; H03K 5/153
[52] U.S. Cl. ........................ 327/198; 327/142; 327/143
[58] Field of Search ........................... 307/272.3, 296.1, 307/296.2, 296.4, 296.5, 362, 350, 358; 327/198, 142, 143, 77, 78

[56] References Cited

U.S. PATENT DOCUMENTS

| | | | |
|---|---|---|---|
| 4,888,498 | 12/1989 | Kadakia | 307/272.3 |
| 4,948,995 | 8/1990 | Takahashi | 307/272.3 |
| 4,970,408 | 11/1990 | Hanke et al. | 307/272.3 |
| 5,083,045 | 1/1992 | Yim et al. | 307/296.1 |
| 5,111,136 | 5/1992 | Kawashima | 307/362 |
| 5,152,614 | 9/1992 | Yamazaki et al. | 307/272.3 |
| 5,157,287 | 10/1992 | Sakagami | 307/296.5 |
| 5,166,546 | 11/1992 | Savignac et al. | 307/272.3 |
| 5,172,012 | 12/1992 | Ueda | 307/272.3 |
| 5,177,375 | 1/1993 | Ogawa et al. | 307/272.3 |
| 5,208,488 | 5/1993 | Takiba et al. | 307/296.4 |
| 5,243,233 | 9/1993 | Cliff | 307/272.3 |
| 5,260,646 | 11/1993 | Ong | 307/296.1 |

FOREIGN PATENT DOCUMENTS

| | | | |
|---|---|---|---|
| 0035345 | 9/1981 | European Pat. Off. | 307/272.3 |
| 0079333 | 5/1983 | Japan | 307/272.3 |
| 0222318 | 10/1986 | Japan | 307/272.3 |
| 0154520 | 6/1990 | Japan | 307/272.3 |
| A2102646 | 2/1983 | United Kingdom . | |
| A2108342 | 11/1983 | United Kingdom . | |

*Primary Examiner*—Timothy P. Callahan
*Assistant Examiner*—T. Lam
*Attorney, Agent, or Firm*—Robert Groover; Betty Formby

[57] ABSTRACT

A power-on reset circuit which employs a supply voltage sensing branch for triggering a first inverter of a pair of cascaded inverters. The intrinsic static consumption of such a POR circuit is strongly reduced by employing a current generator, which is automatically forced to deliver a reduced current during the operation of the integrated circuit, for biasing two transistors functionally connected in said voltage sensing branch into a subthreshold operating condition.

20 Claims, 1 Drawing Sheet

POWER-ON RESET CIRCUIT HAVING A LOW STATIC POWER CONSUMPTION

CROSS-REFERENCE TO RELATED APPLICATION

This application claims priority from European App'n 92830336.1, filed Jun. 26, 1992, which is hereby incorporated by reference.

BACKGROUND AND SUMMARY OF THE INVENTION

The present invention relates to power-on-reset circuits.

In integrated circuits, and particularly in micro-logic circuits, there is often the necessity of integrating therewith specific circuits capable of ensuring the resetting of all the functional elements of the integrated circuit to a certain state whenever power is switched on. This resetting must occur independently of the manner in which the supply voltage is raised from ground potential to the nominal supply voltage level, in order to prevent the occurrence of undesired and unforeseen configurations of the integrated circuit, which may cause malfunctioning and possibly latching of the whole integrated circuit device.

Such circuits are called power-on reset circuits, and are commonly referred to by the acronym "POR". POR circuits perform the aforementioned function. These circuits are capable of generating a resetting pulse of predetermined characteristics upon the switching on of the integrated circuit.

Generally, these POR circuits have an architecture which includes power dissipative, static current paths between the supply voltage nodes and, although these static current paths normally have a relatively high impedance, the persistence of a non-negligible static power consumption is not, in many cases, compatible with design specifications of CMOS integrated circuit devices, which typically have a null-static consumption. This problem is felt even more in special CMOS circuit devices which are destined to function for very short periods of time while being powered solely by the electrical charge stored in an electrolytic capacitor (e.g. of several μF), wherein the static consumption caused by the power-on reset circuit assumes great relevance.

These power-on reset circuits may themselves be a cause of malfunctioning if they are likely to be accidentally triggered by internal or external transients, i.e. noise.

Power-on reset circuits commonly have a structure such as the one which is shown in FIG. 1, which comprises two inverters (the first of which is formed by the complementary pair of transistors M5 and M4 and the second is indicated by the block I) connected in cascade. The output of the second inverter I coincides with the output node of the circuit. A voltage monitoring branch (voltage driver) is connected between the supply node and ground to detect the voltage which is actually present on the supply node, and may comprise (for example) at least two directly biased junctions connected in series to each other (realized, in the example shown, with two diode-configured transistors M1 and M2, and a resistance R1). The intermediate node Vx of this voltage sensing branch drives the first inverter through the gate electrode of the M4 transistor. The capacitance C1 represents the capacitive coupling of the node Vx toward ground potential. The M3 transistor is driven by the voltage which is present on the intermediate connection node A between the two inverters and determines the dropping to zero of the reset signal produced by the POR circuit when the voltage Vx reaches the triggering threshold of the first inverter, that is when the voltage on the supply node has reached a safety level which is sufficiently high in its rise toward the nominal value VDD. In fact, at that point, the voltage on the A node becomes low, thus switching-off the M3 transistor, while the M1 and M2 junctions are kept conducting by R1.

The drawback of such a circuit is current consumption. In fact, when the supply voltage has reached the nominal working level, R1 continues to draw a non-negligible current which, for a value of R1 of 300KΩ and a supply voltage (VDD) of 5V, may be about 6.6 μA. In many instances, such a current static absorption may be outside the specifications of the particular integrated circuit.

The present invention provides a power-on reset (POR) circuit which has the advantages of reduced static power consumption and enhanced immunity to noise.

Basically, the method herein proposed for reducing the current absorption under static condition of a power-on reset circuit comprises biasing with an extremely low current a pair of transistors functionally utilized in the supply voltage monitoring branch, until the supply voltage remains relatively low. This has the purpose and effect of bringing said transistors into a condition normally referred to as "subthreshold" operation. This is a peculiar condition of operation proper of field effect (MOS) transistors which occurs for gate-to-source voltages close to the transistor's threshold voltage. Under these bias conditions, the MOS transistor conducts an extremely low current and the input-to-output transfer characteristic becomes exponential instead of being quadratic. Such an operation condition is amply described in the article entitled "CMOS Analog Integrated Circuits Based on Weak Inversion Operation" by Eric Vittoz and Jean Fellrath, 12 IEEE JOURNAL OF SOLID-STATE CIRCUITS 224 (June 1977), which is hereby incorporated by reference.

Thus, the presently preferred embodiment provides a power-on-reset circuit which employs a supply voltage sensing branch for triggering a first inverter of a pair of cascaded inverters. The intrinsic static consumption of such a POR circuit is strongly reduced by employing a current generator, which is automatically forced to deliver a reduced current during the operation of the integrated circuit, for biasing two transistors functionally connected in said voltage sensing branch into a subthreshold operating condition.

The disclosed inventions teach use of a reference current generator having a characteristic defined by the ratio δVbe/R, by the use of which a first bias current is delivered to a pull-up element of the first inverter of the circuit according to a certain current-mirror ratio, and a second bias current is delivered to a first element of said supply voltage monitoring branch which is functionally connected to the supply node, in order to force a certain current through this sensing branch. The intermediate node of connection in cascade between two inverters of the circuit drives a second element capable of being biased and functionally connected to ground of the supply voltage sensing branch, as well as a control terminal of the current generator, through which the current delivered by the generator may be modified in order to reduce it during the periods of operation of the integrated circuit.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
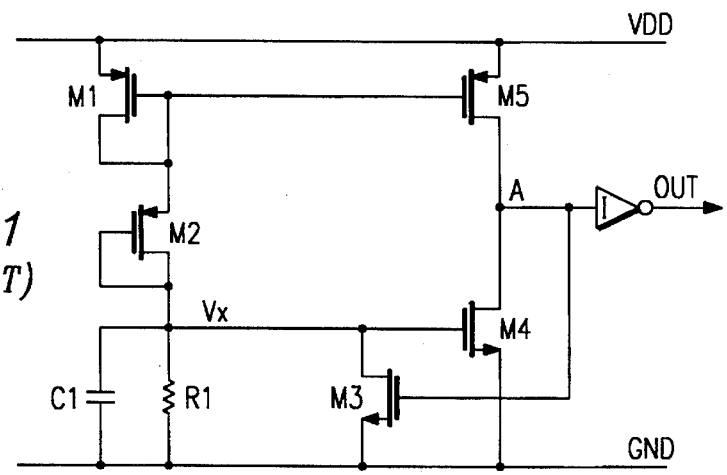
FIG. 1 is a circuit diagram of a power-on reset circuit of the prior art, as already described before.
Figure 2:
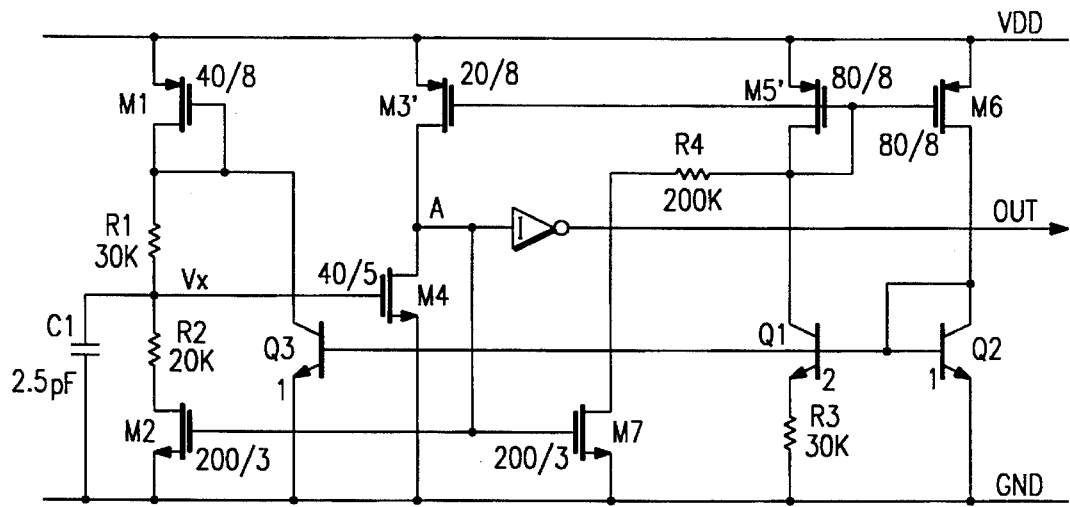
FIG. 2 shows a power-on reset circuit made in accordance with the present invention.

With reference to FIG. 2, the main aspect of the circuit of the invention is represented by the use of a current generator having an operating characteristic of a δVbe/R type and which preferably may be implemented by the use of a pair of transistors, Q1 and Q2, and a current mirror made with a pair of MOS transistors, M5' and M6. In the embodiment shown, an imbalance between the emitter voltages of the transistors Q1 and Q2, which is transformed to a current signal by the resistance R3 (emitter degeneration of Q1), is determined by making transistors Q1 and Q2 of different sizes, e.g. the Q1 transistor is twice the size of the Q2 transistor. The pair of MOS transistors which form the current mirror may have, in the context of the example shown, identical dimensions (indicated by their "aspect ratio" 80/8, where the first number indicates the drawn channel width and the second number the drawn channel length in microns). The current mirror formed by the transistors M5' and M6 forces the same current through the transistors Q1 and Q2. This type of current generator is well known in literature and the current which flows through Q1 and Q2 is given by $I_{Q1}=I_{Q2}=(V_T \ln(A1/A2))R3$, where $V_T$ is the so-called "thermal voltage" kT ($\approx$26 mV at 300K) and A1/A2 is the area ratio between Q1 and Q2. Therefore, at room temperature such a current will have a value given by $I_{Q1}=I_{Q2}=0.6$ μA. The PMOS gate voltage defined by this current is utilized for biasing the pull-up element M3' of the first inverter. (The first inverter is formed by the pair of complementary transistors M3' and M4. Sample dimensions for these devices are indicated by the relative values shown in FIG. 2.) Actually the M3' transistor is biased by mirroring the generator current according to a certain current mirror ratio which, for the example shown in FIG. 2 is given by M5'/M3'=(80/8)/(20/8)=4. Therefore, the bias current of M3' is: 0.6 μA/4=0.15 μA.

Moreover, the generator's current is also delivered through transistor Q3 as a biasing current to an element of the voltage sensing branch capable of being biased (e.g. MOS transistor M1, having sample dimensions as indicated in the figure). In practice, the M1 transistor may be biased with the same current which flows through the transistors Q1 and Q2 (0.6 μA), through the transistor Q3, the base of which is connected to the bases of the transistors Q1 and Q2 of the current generator.

After having so examined the biasing arrangements, the operation of the whole circuit may be described as follows.

At the instant the voltage on the supply node starts to rise (i.e. upon switching-on the device) the intermediate driving node Vx of the sensing or biasing branch, between the two limiting resistances R1 and R2, because of its capacitive coupling to ground, which is depicted by the capacitance C1, remains for a certain period of time at a relatively low level and permits the drain of the pull-down element M4 of the first inverter to follow VDD up. As a consequence, the output (OUT) remains low and the transistors M2 and M7 turn on as VDD becomes greater than $V_{TN}$.

The conduction of M2 practically ties to ground potential one terminal of the resistance R2, while the conduction of M7 practically connects to ground a terminal of the resistance R4. This purposely modifies the working conditions of the current generator which, as long as the resistance R4 remains substantially connected to ground (thus constituting a by-pass path of the current which is forced through the circuit of the current generator), determines altered operation conditions of the current generator. In these conditions, the generator delivers a relatively high current as compared to the current which would be delivered under normal operation conditions of the generator (when the resistive connection to ground through R4 is inactive, i.e. during a stand-by period of the circuit). Under these conditions, when the voltage on the supply node has reached a level of 3V, the current delivered by the generator would be given by $$(VDD-V_{gsM5'})/R4=1.7 \text{ V}/200\text{k}\Omega=8.5 \text{ μA}.$$

Therefore, the current through the pull-up transistor M3' of the first inverter will be equal to about 2 μA.

The triggering of the circuit will take place when the voltage on the supply node reaches a value so that:

$$I_{M4}=I_{M3}\approx 2 \text{ μA}.$$

The equation describing the operation of the circuit may then be written as:

$$I_{M3}=I_{M4}\approx Kn(W/L)_{M4}(V_{gsM4}-V_{TN})^2,$$

since $$V_{gsM4}=(VDD-V_{gsM1})(R2/(R2+R1))$$

and $$V_{gsM1}=V_{TP}+(I_{M1}Kp(W/L)_{M1})^{-1/2},$$

wherein

Kn and Kp are technological constants (i.e. characteristic of a particular fabrication process of the device), W/L is the aspect ratio, i.e. the ratio between the channel width and the channel length, and $V_{TN}$ and $V_{TP}$ are the threshold voltages of n-channel and p-channel transistors respectively. The current which flows through the transistor M1 of the sensing (biasing) branch depends on the value of the two limiting resistances R1 and R2.

The relatively complicated equation may be resolved through a process of re-normalization with the aid of a computer and leads to a triggering voltage of about 3.6V.

When this triggering voltage is reached by the node Vx, the circuit triggers. The output OUT becomes high, M2 and M7 are switched-off and the current generator returns to generate its characteristic current thus modifying the bias of the pull-up transistor M3' of the first inverter which will conduct a current given by: $I_{M3'}=-0.15\ \mu A$. Similarly, transistor M1 of the supply voltage monitoring branch will return to conduct a current given by: $I_{M1}=0.6\ \mu A$, under the control of the current generator (Q1, Q2) which is now free of the additional current forced by the ground connection through the resistance R4.

Under these conditions the total consumption of the circuit, as described in FIG. 2, is 2 µA, which is made up of the following contributions: $I_{M5'}$, 0.6 µA; $I_{M6}$, 0.6 µA; $I_{M3'}$, 0.15 µA; $I_{M1}$, 0.6 µA; and such a condition of power consumption remains unaltered by a variation of the supply voltage within a certain design range during the normal operation of the integrated circuit.

When the supply voltage drops (e.g. upon the switching-off of the integrated circuit), the circuit will trigger again when the voltage on the control node Vx of the supply voltage monitoring branch drops below the triggering voltage of the M4 transistor, i.e.:

$$VDD-V_{gsM1}=V_{gsM4}.$$

Because of the relatively low current levels of the circuit, it may be assumed that, under this condition, $$V_{gsM1}=V_{TP} \text{ and}$$

$$V_{gsM4}=V_{TN},$$

and thus:

$$VDD-V_{TP} \approx V_{TN}.$$

Thus, the triggering of the circuit will occur when $$VDD=V_{TN}+V_{TP} \approx 2V.$$

This is an extremely advantageous characteristic of operation because, by considering that normally logic circuits are still functioning when $VDD=V_{TN}+V_{TP}$, the action of the power-on reset circuit of the invention positively occurs when the value of the voltage on the supply node has reached a level at which the integrated circuit is still functioning correctly.

Figure 3:
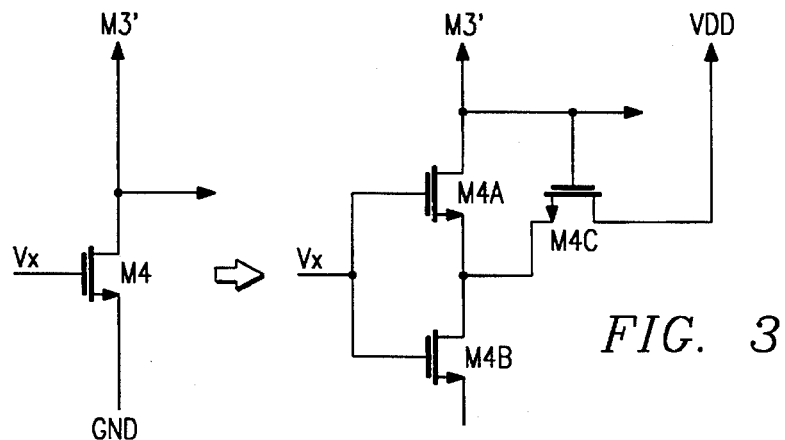
FIG. 3 shows how the pull-down element of the first inverter of the power-on reset circuit may be made so as to introduce a certain hysteresis in the triggering performance of the inverter.

According to a particularly preferred embodiment of the circuit, the pull-down transistor M4 of the first inverter of the circuit may be advantageously replaced by an appropriate, equivalent structure, as the one depicted in FIG. 3, formed by three n-channel MOS transistors, M4A, M4B and M4C. The use of this equivalent pull-down structure is particularly preferred because it introduces a small hysteresis in the triggering response of the first inverter of the circuit, thus increasing the noise immunity characteristics of the POR circuit of the invention.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A power-on reset circuit for generating a reset signal which, upon powering the circuit follows a voltage present on a supply node until it reaches a preset level and thereafter stably switches to ground potential substantially comprising:

a first and a second inverter connected in cascade, the output of the second inverter constituting the output of the circuit;

a supply voltage sensing branch connected between said supply node and ground and capable of providing on an intermediate node thereof a driving signal for said first inverter;

means, driven by a second signal present on a connection node between said two inverters, for receiving said driving signal from said supply voltage sensing branch and for driving a current through said supply voltage sensing branch when said driving signal is lower than a triggering threshold of said first inverter: and a current generator
having a control terminal and
capable of being operated either in a first operating condition wherein a first current is generated or in a second operating condition wherein a second current generated is lower than said first current,
and which causes a pull-up element of said first inverter to provide a first bias current to a first element of said first inverter capable of being biased by said voltage sensing branch,
and which is functionally connected to said supply node in order to drive a certain current through said sensing branch;

said connection node between said two inverters being connected to said control terminal of the current generator and to a control terminal of said means;

said first inverter and said means being interconnected so that the triggering of said first inverter causes the switching off of said means and a resulting reduction of the bias current delivered by said current generator.

2. The circuit as defined in claim 1, wherein said intermediate node of the voltage sensing branch is connected to said supply node by a series combination of a resistance and a diode-connected p-MOS transistor and to ground by a series combination of a second resistance and an n-MOS transistor:

said diode-connected P-MOS transistor being biased with a gate-to-source voltage close to the threshold voltage thereof, in order to determine a subthreshold working condition of said diode-connected P-MOS transistor upon powering the circuit.

3. A circuit as defined in claim 2, wherein said current generator has an operating characteristic of a δVbe/R type and said control terminal is constituted by a gate electrode of said n-MOS transistor which establishes a by-pass current path toward ground in order to hold said current generator in said first condition of operation until the triggering of said first inverter occurs.

4. A circuit as defined in claim 1, wherein said first element of said first inverter is a pull-down element made of an n-MOS transistor.

5. A circuit as defined in claim 1, wherein said first element of said first inverter comprising a pull-down element and an transistor elements connected thereto to introduce hysteresis in the triggering characteristic of the inverter.

6. An integrated power-on-reset circuit, comprising:

connections for receiving first and second power supply voltages;

a first inverter connected to drive a second inverter to provide an output signal indicating when said first power supply voltage are outside of an acceptable range of voltages;

a voltage detection circuit connected to drive said first inverter at a voltage detection node, said voltage detection circuit comprising a first field-effect transistor element connected to provide a predetermined minimum voltage drop from said first power supply voltage to said voltage detection node;

a variable biasing circuit,
operatively connected to be controlled by an output of one of said inverters, and
operatively connected to shift a threshold voltage of said first inverter, and
operatively connected to provide a current bias to said voltage detection node which is dependent on the state of said first inverter, and which maintains said first field-effect transistor element in subthreshold operation during at least some conditions of operation;

whereby, when first power supply voltage is first applied, power consumption of the circuit is greatly reduced after said first inverter switches.

7. The circuit of claim 6, further comprising a capacitor connected between said voltage detection node and said second power supply voltage.

8. The circuit of claim 6, wherein said second power supply voltage is a ground voltage.

9. An integrated power-on-reset circuit, comprising:

connections for receiving first and second power supply voltages;

a first inverter comprising a first driver circuit connected to drive an output node toward said first power supply voltage, and a second driver circuit connected to drive said output node toward said second power supply voltage;

a second inverter connected to be driven by said output node of said first inverter, and connected to provide an output signal accordingly;

a voltage detection circuit connected, at a voltage detection node, to drive said second driver of said first inverter; said voltage detection circuit comprising a first field-effect transistor element which is connected to provide a predetermined minimum voltage drop from said second power supply voltage to said voltage detection node;

a variable biasing circuit,
operatively connected to be controlled by an output of one of said inverters, and
operatively connected to provide a gate voltage to said first driver of said first inverter which is dependent on the state of said first inverter, and
operatively connected to provide a bias current to said voltage detection node which is dependent on the state of said first inverter, and which maintains said first field-effect transistor element in subthreshold operation during at least some conditions of operation;

whereby, when second power supply voltage is first applied, power consumption of the circuit is greatly reduced after said first inverter switches.

10. The circuit of claim 9, further comprising a capacitor connected between said voltage detection node and said first power supply voltage.

11. The circuit of claim 9, wherein said variable biasing circuit comprises at least one transistor which is directly connected to be controlled by an output of said first inverter, and which is connected to draw a current through said first field effect transistor element of said voltage detection circuit.

12. The circuit of claim 9, wherein said first power supply voltage is a ground voltage.

13. The circuit of claim 9, wherein said first power supply voltage is more negative than said second power supply voltage.

14. The circuit of claim 9, wherein said voltage detection circuit further comprises a second element in series with said first field effect transistor element which provides an additional current-dependent voltage drop between said second power supply voltage and said voltage detection node.

15. An integrated power-on-reset circuit, comprising:

connections for receiving first and second power supply voltages;

a first inverter, comprising first and second drivers, connected to drive a second inverter to provide an output signal indicating when said second power supply voltage are outside of an acceptable range of voltages;

a voltage detection circuit connected, at a voltage detection node, to drive said second driver of said first inverter; said voltage detection circuit comprising a first field-effect transistor element which is connected to provide a predetermined minimum voltage drop from said second power supply voltage to said voltage detection node;

a current generator circuit, operatively connected to provide a substantially invariant bias current to maintain said first field effect transistor element of said voltage detection circuit in a condition of subthreshold conduction whenever said output of said first inverter is in a first state;

a variable biasing circuit, configured and connected to provide an increased bias current to said first effect transistor element of said voltage detection circuit whenever said output of said first inverter is in a second state;

whereby, when first power supply voltage is first applied, power consumption of the circuit is greatly reduced after said first inverter switches.

16. The circuit of claim 15, further comprising a capacitor connected between said voltage detection node and said first power supply voltage.

17. The circuit of claim 15, wherein said variable biasing circuit comprises at least one transistor which is directly connected to be controlled by an output of said first inverter, and which is connected to draw a current through said first field effect transistor element of said voltage detection circuit.

18. The circuit of claim 15, wherein said first power supply voltage is a ground voltage.

19. The circuit of claim 15, wherein said first power supply voltage is more negative than said second power supply voltage.

20. The circuit of claim 15, wherein said voltage detection circuit further comprises a second element in series with said first field effect transistor element which provides an additional current-dependent voltage drop between said second power supply voltage and said voltage detection node.

* * * * *